United States Patent [19]
Foo

[11] Patent Number: 5,545,992
[45] Date of Patent: Aug. 13, 1996

[54] FAST CARDIAC GATED NMR ACQUISITION WITH IMPROVED $T_1$ CONTRAST

[75] Inventor: Thomas K. Foo, Waukesha, Wis.

[73] Assignee: General Electric Company, Milwaukee, Wis.

[21] Appl. No.: 510,683

[22] Filed: Aug. 3, 1995

[51] Int. Cl.$^6$ ................................................ G01V 3/00
[52] U.S. Cl. ................................ 324/309; 128/653.2
[58] Field of Search .................. 128/653.2; 324/300, 324/307, 308, 309, 310, 311, 312, 313, 314, 318, 322

[56] References Cited

U.S. PATENT DOCUMENTS

| | | |
|---|---|---|
| 5,256,967 | 10/1993 | Foo et al. ................................ 324/311 |
| 5,347,216 | 9/1994 | Foo ........................................ 324/309 |
| 5,429,134 | 7/1995 | Foo ........................................ 128/653.2 |

OTHER PUBLICATIONS

*Ultrafast Interleaved Gradient–Echo–Planar Imaging on a Standard Scanner*, MRM 30:609–616 (1993), G. C. KcKinnon.

*Improved Ejection Fraction and Flow Velocity Estimates with Use of View Sharing and Uniform Repetition Time Excitation with Fast Cardiac Techniques*, Radiology, May 1995, vol. 195 No. 2, 471–478, Foo, et al.

*Primary Examiner*—Michael Tokar
*Attorney, Agent, or Firm*—Quarles & Brady

[57] ABSTRACT

A fast gradient echo, cardiac gated NMR scan is performed by acquiring groups of views during each cardiac cycle. Each group of views is preceded by an accelerator RF pulse and disdaq pulse sequences to improve $T_1$ contrast and drive spin magnetization rapidly to dynamic equilibrium.

11 Claims, 4 Drawing Sheets

FAST CARDIAC GATED NMR ACQUISITION WITH IMPROVED $T_1$ CONTRAST

BACKGROUND OF THE INVENTION

The field of the invention is nuclear magnetic resonance imaging methods and systems. More particularly, the invention relates to the acquisition of cardiac gated images.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal emitted by the excited spins may be received after the excitation signal $B_1$ is terminated and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well-known reconstruction techniques.

Most NMR scans currently used to produce medical images require many minutes to acquire the necessary data. The reduction of this scan time is an important consideration, since reduced scan time increases patient throughput, improves patient comfort, and improves image quality by reducing motion artifacts. There is a class of pulse sequences which have a very short repetition time (TR) and result in complete scans which can be conducted in seconds rather than minutes. When applied to cardiac imaging, for example, a complete scan from which a series of images showing the heart at different phases of its cycle can be acquired in a single breath-hold.

Whereas the more conventional pulse sequences have repetition times TR which are much greater than the spin-spin relaxation constant $T_2$ so that the magnetization has time to relax between the phase coherent excitation pulses in successive sequences, the fast pulse sequences have a repetition time TR which is less than $T_2$ and which drives the transverse magnetization into a steady-state of equilibrium. Such techniques are referred to as steady-state free precision (SSFP) techniques and they are characterized by a cyclic pattern of transverse magnetization in which the resulting NMR signal refocuses to produce an echo signal.

One such SSFP pulse sequence is called gradient refocused acquired steady-state (GRASS) and it utilizes a readout gradient $G_x$ to shift the peak in the NMR echo signal that is produced after each RF excitation pulse toward the center of the pulse sequence. This pulse sequence is shown in FIG. 3, where the NMR signal is a gradient recalled echo that is induced by the readout gradient $G_x$. In two-dimensional imaging, a slice selection gradient pulse is produced by the gradient $G_z$ and is immediately refocused in the well-known manner. A phase encoding gradient pulse $G_y$ is produced shortly thereafter to position encode the acquired NMR data, and to preserve the steady-state equilibrium, the effects of the phase encoding gradient pulse are nullified by a corresponding $G_y$ rewinder gradient pulse after the NMR signal has been acquired and before the next pulse sequence begins as described in U.S. Pat. No. 4,665,365.

Because SSFP sequences employ RF excitation pulses with small tip angles and the magnetization is not allowed to recover after each pulse sequence, the image contrast due to spin density is not nearly as good as with conventional pulse sequence. Consequently, other image contrast enhancement methods have been proposed which rely on the different $T_1$ and $T_2$ constants of tissues.. As described by A. Haase in "Snapshot Flash MRI Applications to $T_1$, $T_2$, and Chemical-Shift Imaging," Magnetic Resonance In Medicine, 13, 77/14 89 (1990), and D Matthaei et al in "Fast Inversion Recovery $T_1$ Contrast and Chemical Shift Contrast In High Resolution Snapshot Flash MR Images, " Magnetic Resonance In Medicine, Vol 10, pp. 1–6, 1992, and U.S. Pat. No. 5,256,967 entitled "Fast NMR Image Acquisition With Spectrally Selective Inversion Pulses," a series of SSFP pulse sequences may be preceded by one or more preparatory RF pulses which condition the spin magnetization to provide $T_1$ or $T_2$ enhanced contrast images. These methods all require a considerable waiting period before acquisition of image data in order to allow the contrast to evolve.

Cardiac gated acquisitions are employed to produce images depicting the heart at different phases of the cardiac cycle. By using SSFP pulse sequences, a "group" of k-space lines, or views (e.g. 8) may be acquired during each cardiac cycle for a particular slice location. As a result, data for an image may be acquired in a succession of cardiac cycles and during a single breath-hold. Note that each group of views may be acquired from the same spatial location, in which case a series of images at the same spatial location is obtained with each image acquired at a different temporal phase of the cardiac cycle. This represents a multi-phase or cine acquisition. In addition, each group may be acquired from different spatial locations, in which case a series of images, each at a different spatial location are acquired at different temporal phases of the cardiac cycle. This second implementation represents a single-phase multi-slice acquisition where temporal coverage of the cardiac cycle is traded-off for greater spatial coverage in an acquisition.

In the case of a single-phase multi-slice acquisition, the magnetization at a given spatial location is not at dynamic equilibrium. Since one cardiac cycle is of the order of 1 second, the longitudinal magnetization has sufficient time to relax to its thermal equilibrium value between groups. As a result, during each group of SSFP pulse sequences, the magnetization does not have time to establish a steady-state condition. The resulting image contrast is then primarily determined by spin density rather than $T_1$ , and valuable clinical information is lost.

SUMMARY OF THE INVENTION

The present invention is a method for quickly driving the transverse magnetization of spins to a steady state of equilibrium prior to the acquisition of NMR data using a series of fast pulse sequences in order to enhance the $T_1$ contrast in the reconstructed image. More particularly, prior to each group of rapid NMR signal acquisitions, a preparatory sequence is performed in which an RF excitation pulse of substantially 90° flip-angle is applied to the spins and a plurality of disdaq pulse sequences are performed to quickly drive the magnetization to a steady-state of equilibrium prior to performing a pulse sequence in which NMR data is acquired.

A general object of the invention is to enhance $T_1$ contrast in a rapidly acquired NMR image by quickly driving spin magnetization to a steady-state of equilibrium prior to data acquisition. Rather than inverting the magnetization with a 180° RF excitation pulse, or simply applying a series of disdaq pulse sequences to drive the magnetization to steady-state equilibrium, the best image contrast is obtained with the least impact on scan time by applying a 90° RF excitation pulse followed by a few disdaq pulse sequences. This is the quickest path to the desired steady-state equilibrium in which $T_1$ weighted NMR signals are acquired.

DESCRIPTION OF THE PREFERRED EMBODIMENT

Figure 1:
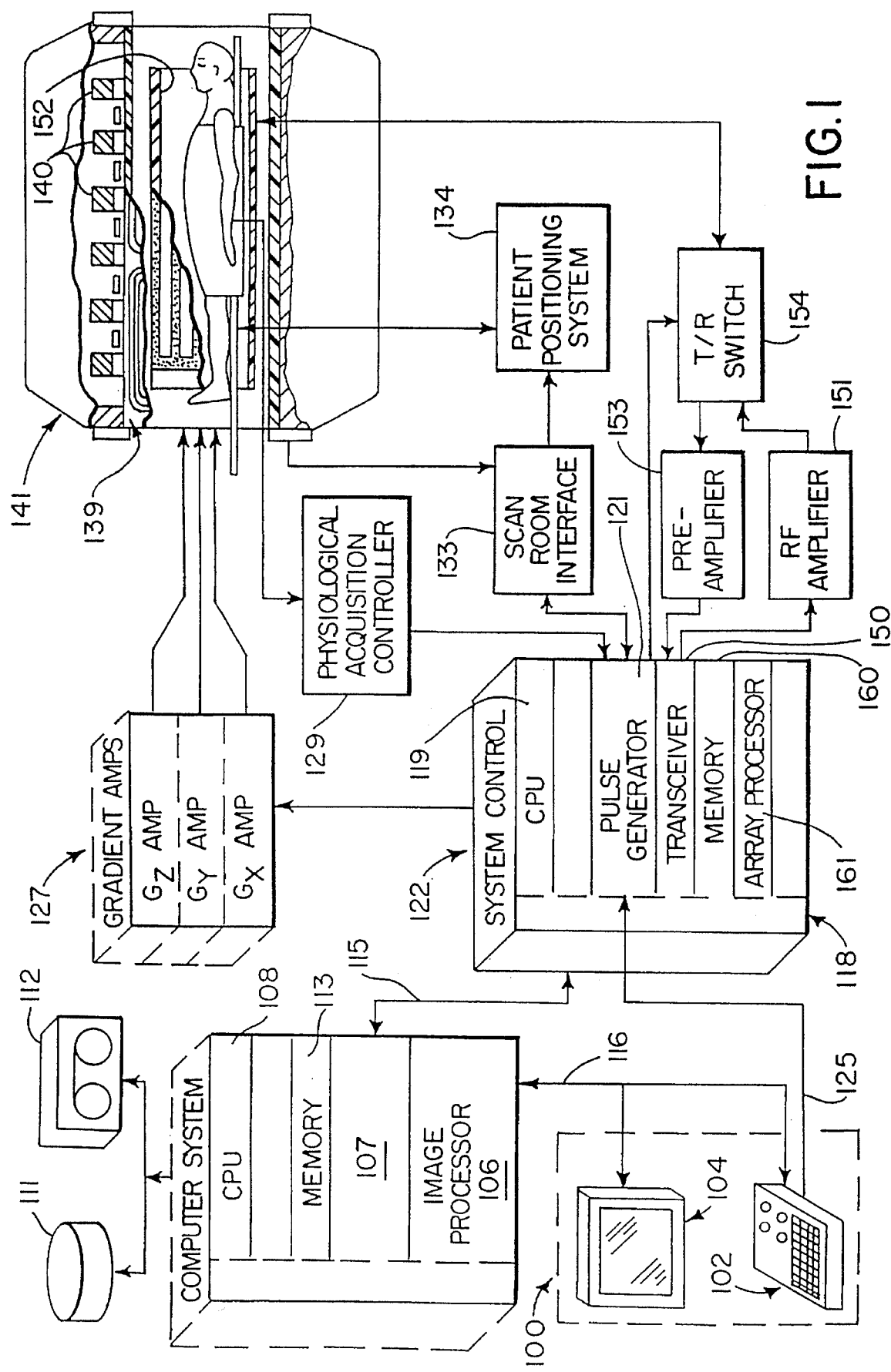
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprising $G_x$, $G_y$, and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104. For a more detailed description of the transceiver 150, reference is made to U.S. Pat. Nos. 4,952,877 and 4,992,736 which are incorporated herein by reference.

Figure 2:
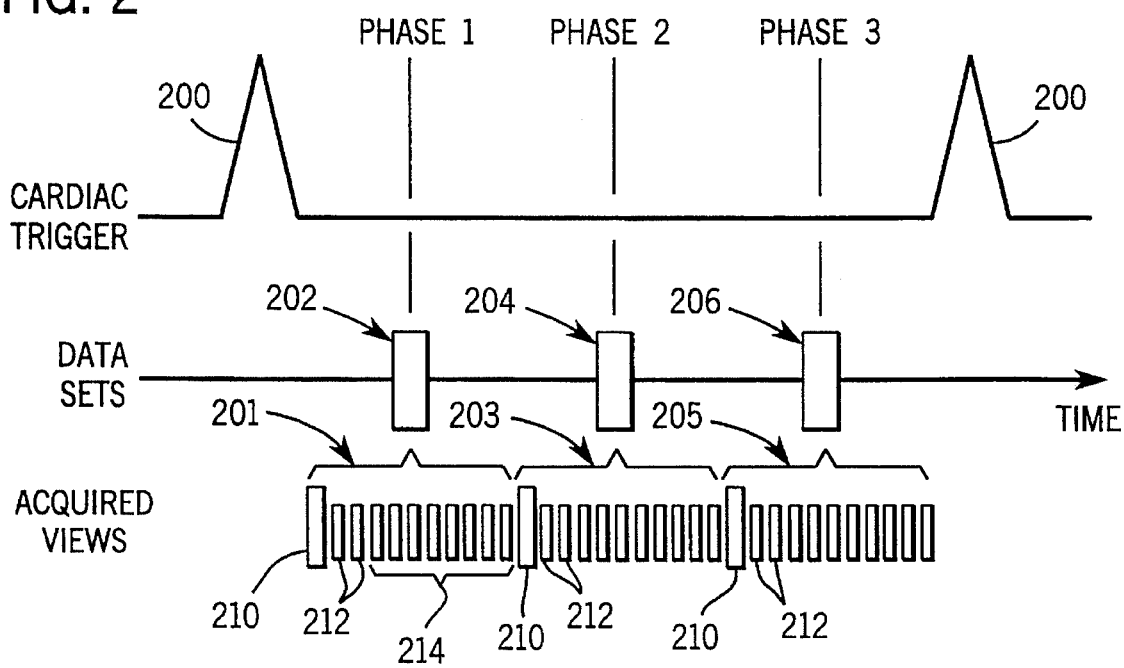
FIG. 2 is a graphic representation of the data acquisition sequence performed by the MRI System of FIG. 1.

Referring particularly to FIG. 2, the cardiac acquisition employs a series of fast gradient echo pulse sequences, with the repetition time, TR, of each gradient echo pulse sequence of between 6 and 15 ms, depending on the type of gradient hardware available and imaging parameters chosen. These pulse sequences are executed during the interval between the cardiac trigger signals 200 referred to as the R-R interval. The length of the R-R interval is a function of the patient's heart rate, but is typically on the order of one second.

In a fast cardiac acquisition using gradient echoes, the R-R interval is divided up into many short segments, with each segment being a fast gradient acquisition pulse sequence with a nominal flip-angle of between 20°–40°. Each fast gradient echo segment acquires an NMR signal representing a single line of k-space which is sometimes referred to as a phase encoded view, or a "view". Adjacent fast gradient echo segments are further combined into groups of "n" where n is typically between 1 and 8. "n" is often referred to as the number of phase encoded views per group. The data from each group contributes to generating an image at different temporal phases of the cardiac cycle (R-R interval). The temporal location of these phase images depends on the relative time from the cardiac trigger (R-wave) 200 to the center of each group of fast gradient echo segments. In FIG. 2, the first group of segments form the group 201 which acquires views for a first k-space data set 202. The next group of fast gradient echo segments form another group 203 which acquires views at a second cardiac phase for a second k-space data set 204, and a third group of segments form another group 205 which acquires views for a third k-space data set 206. In the preferred embodiment, each of the three images acquired at the separate cardiac phases 1, 2 and 3 are also acquired from separate slice locations in the patient. As a result, spin magnetization in each slice has an opportunity to relax for nearly one cardiac cycle ($\approx$1 second) between acquisition of each successive group of views.

The number of cardiac phases (or the number of slice locations acquired in a single-phase multi-slice acquisition) imaged during an acquisition depends on the number of groups of n phase encoded views per group which can fit into the patient's R-R interval. Eight fast gradient echo segments are nominally chosen to constitute a group as this provides a compromise between the temporal resolution of each image (defined as the time needed to acquire data from a group of 8 segments), and the total image acquisition time. As 128 views are nominally required to form a complete image, using 8 segments per group means that 8 views of k-space are acquired per cardiac trigger. Hence, 16 cardiac triggers are needed to complete the data acquisition for a conventional MRI image, a time which is within the ability of most patients to maintain a breath-hold.

In the preferred embodiment with 8 phase encoded views per group, after 16 heart beats all 128 phase encoded views are acquired for each data set 202, 204 and 206. Each k-space data set 202, 204 and 206 is then employed to reconstruct an image by performing a two-dimensional Fourier transformation as is well-known to those skilled in the art. The resulting images depict the heart at three slice locations and successive phases of the cardiac cycle, labelled phase 1, phase 2 and phase 3 in FIG. 2. Note also that in the preferred embodiment, labeled phase 1, phase 2, and phase 3 also represent labeled location 1, location 2, and location 3, respectively.

Figure 3:
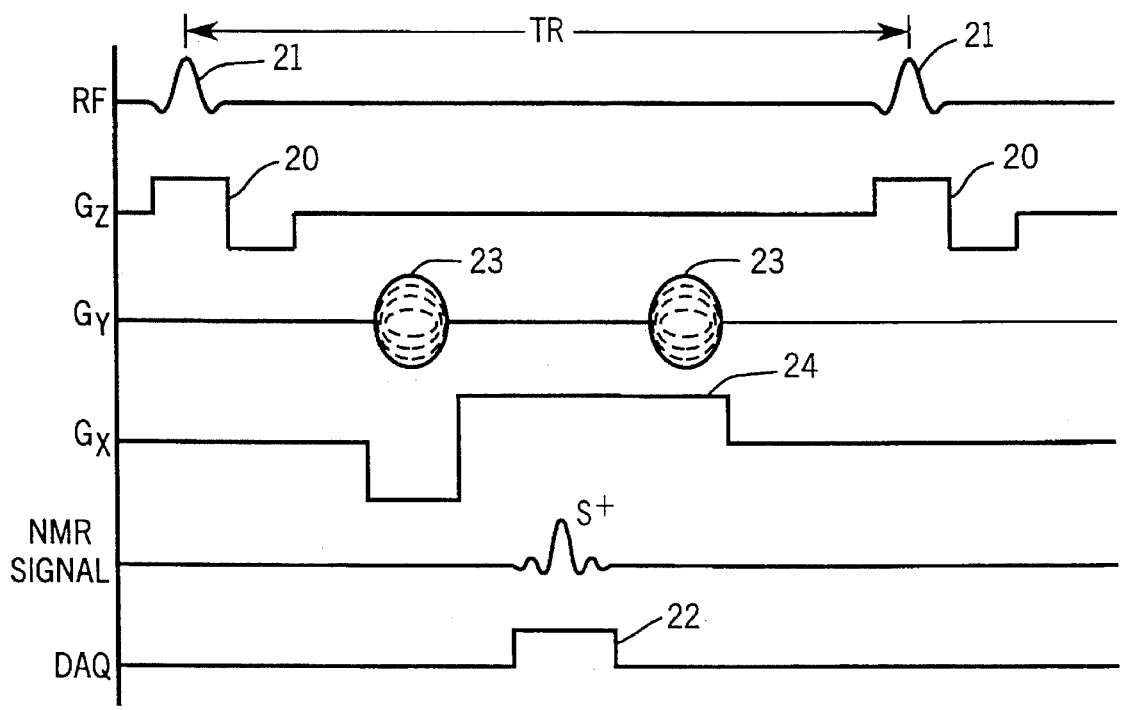
FIG. 3 is a graphic representation of a pulse sequence used to acquire views in the acquisition of FIG. 2.

Referring particularly to FIG. 3, the fast pulse sequence employed in the preferred embodiment of the invention acquires the S+NMR signal and is known in the art as a gradient refocused acquired steady-state (GRASS) sequence. A $G_z$ slice select gradient 20 is applied along with a selective RF excitation pulse 21 having a nominal flip-angle of 20° to 40°. In the preferred embodiment, a short TE time is desirable to minimize flow-induced dephasing effects. Short TE times are preferred regardless of whether flow compensation is used. The TR time should also be as short as possible to minimize spatial blurring artifacts from motion averaged over the time required to acquire data for a single group of views. On method of reducing the sequence TR is to use a partial echo. To reduce the TR to 6.8 msec a partial-echo acquisition of 160 frequency encoded data samples are acquired during a data acquisition window 22 and a $G_x$ readout gradient 24 provides the desired field of view. An effective resolution in the frequency encoding direction (x-axis) of 256 is achieved by employing a homodyne image reconstruction as described in U.S. Pat. No. 5,168,227, filed on May 1, 1991 and entitled "High Resolution Imaging Using Short TE and TR pulse Sequences With Asymmetric NMR Echo Acquisition". During the acquisition of each slice, the $G_y$ phase encoding gradient pulses 23 are stepped through 128 discrete values to acquire a corresponding number of "views". With eight views acquired during each cardiac cycle, the complete image can be acquired in a scan of 14 to 16 seconds.

Referring again to FIG. 2, the longitudinal magnetization recovers markedly between acquisitions in successive cardiac cycles. As a result, there is little difference in the NMR signals produced by spins of differing $T_1$ relaxation times and little image contrast between tissues such as the myocardium and flowing blood. To provide such contrast it is desirable to drive the longitudinal magnetization into a dynamic equilibrium in which short $T_1$ spin species will produce much larger NMR signals than long $T_1$ spin species. This can be accomplished by performing dummy pulse sequences (referred to in the art as "disdaqs") in which the pulse sequence is performed, but no NMR signal is acquired. As shown by the solid line 30 in FIG. 4, this requires about 18 to 20 disdaq sequences to drive the longitudinal magnetization to the dynamic equilibrium level indicated by line 31. This is unsatisfactory as it increases the time required to acquire each group of eight views by more than a factor of three.

One teaching of the present invention is that the dynamic equilibrium state of the magnetization can be established faster by employing an initial rf excitation pulse with a very high flip-angle to drive the magnetization into saturation. This initial rf excitation pulse, called an rf accelerator pulse, helps to drive the approach to the dynamic equilibrium steady-state from below the dynamic equilibrium level as indicated by line 31.

Figure 4:
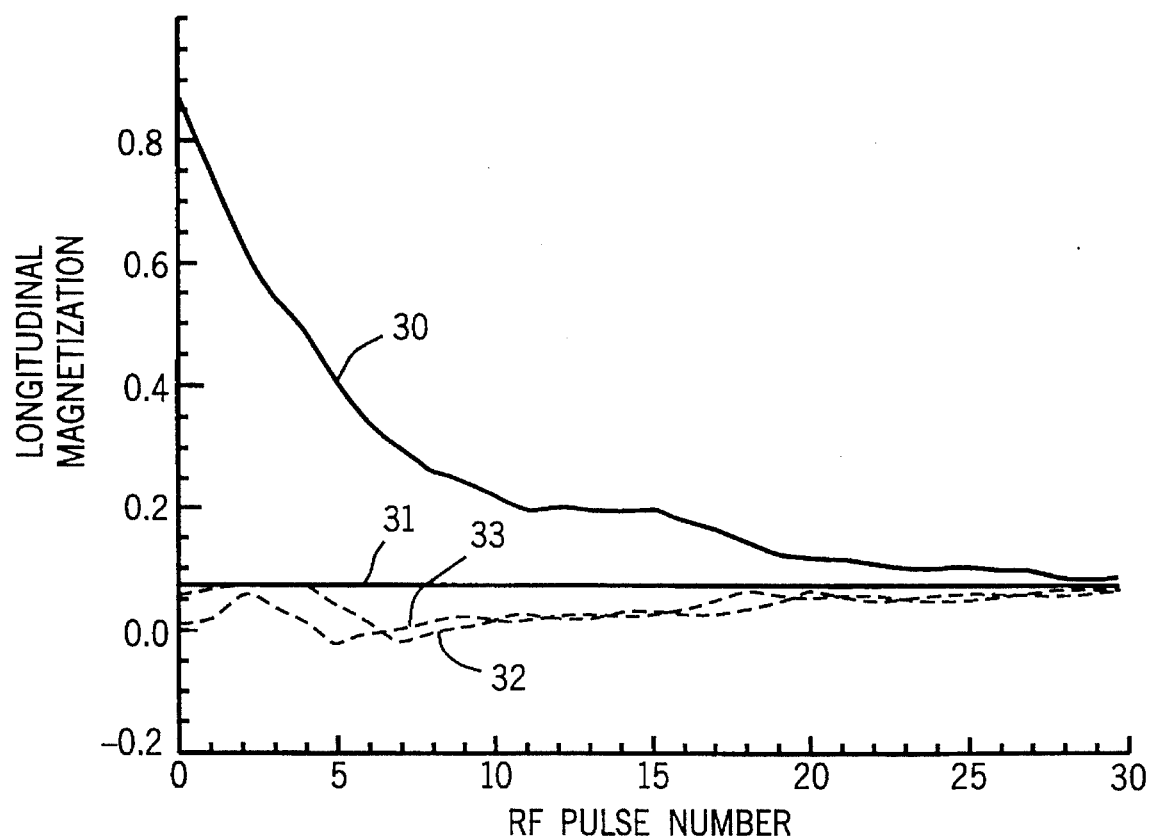
FIG. 4 is a graphic representation of different paths for driving longitudinal magnetization to dynamic equilibrium.

As the dynamic equilibrium state in fast gradient echo pulse sequences with short TR times is a small fraction of the available longitudinal magnetization, Mo, it takes a much shorter time to approach dynamic equilibrium from a small value of Mz rather than from a value of Mz which is close to Mo. This is illustrated in FIG. 4 where the dashed line 32 shows the effect of the rf accelerator pulse driving the magnetization to the steady-state in approximately 5–8 TR periods rather than 18–20. The rf accelerator pulse has a nominal flip-angle of 90°.

A further teaching of the present invention is that the data acquisition can be delayed by one or more of the disdaq periods after the application of the rf accelerator pulse. In this manner, the magnetization during the data acquisition of the group of views appears to attain the dynamic equilibrium state even faster. This is illustrated by the dot-dashed line 33 which shows the approach to steady-state for heart muscle following a 90° rf accelerator pulse and two disdaqs.

Referring again to FIG. 2, the present invention is applied to the fast cardiac gated acquisition by adding an RF accelerator pulse 210 and two disdaq sequences 212 to each pulse sequence group 201, 203 and 205. The RF accelerator pulse 210 is applied as a fast gradient echo pulse sequence as shown in FIG. 3, but no NMR data is acquired. An advantage of driving the longitudinal magnetization to equilibrium with the same pulse sequence used to subsequently acquire NMR data is that any eddy currents introduced by the rapidly switching gradient fields have an opportunity to stabilize before NMR data is acquired. This reduces phase errors in the acquired data which might otherwise produce image artifacts.

In the preferred embodiment of the invention, the RF accelerator pulse 210 has a 90° flip-angle. In fact, substantial improvement can be achieved with an RF accelerator pulse flip-angle between 60° and 140°. However, $T_1$ contrast of tissues improves when larger flip-angles are used, and the signal-to-noise ratio of the acquired NMR signals improves when smaller flip-angles are used. A flip-angle of approximately 90° provides an optimal trade-off between these two conflicting performance parameters.

The number of disdaq sequences 212 that follow the RF accelerator pulse 210 are determined by a number of factors. An intervening period of time is needed after the RF accelerator pulse 210 in order to enable tissue discrimination due to different $T_1$ relaxation times to evolve. This is similar to the TI time in an inversion recovery experiment except the time period in the present case is an order of magnitude shorter. The choice of two disdaqs 212 was made because it allows $T_1$ contrast to evolve, it drives the longitudinal magnetization toward dynamic equilibrium and it does not unduly lengthen the number of pulse sequences in each group 201, 203 and 205. An increase in the number of disdaqs 212 used will improve $T_1$ contrast and reduce image artifacts at the expense of increased scan time or a reduction in the number of slices acquired during the scan.

Because the magnetization is sampled during the approach to the steady-state equilibrium, there will be unequal weighting of the different acquired views. This variable weighting acts as a k-space filter which contributes to image blurring. In order to minimize this effect, a variable flip-angle scheme for all the RF pulses within a group, including the disdaqs is used.

Figure 6:
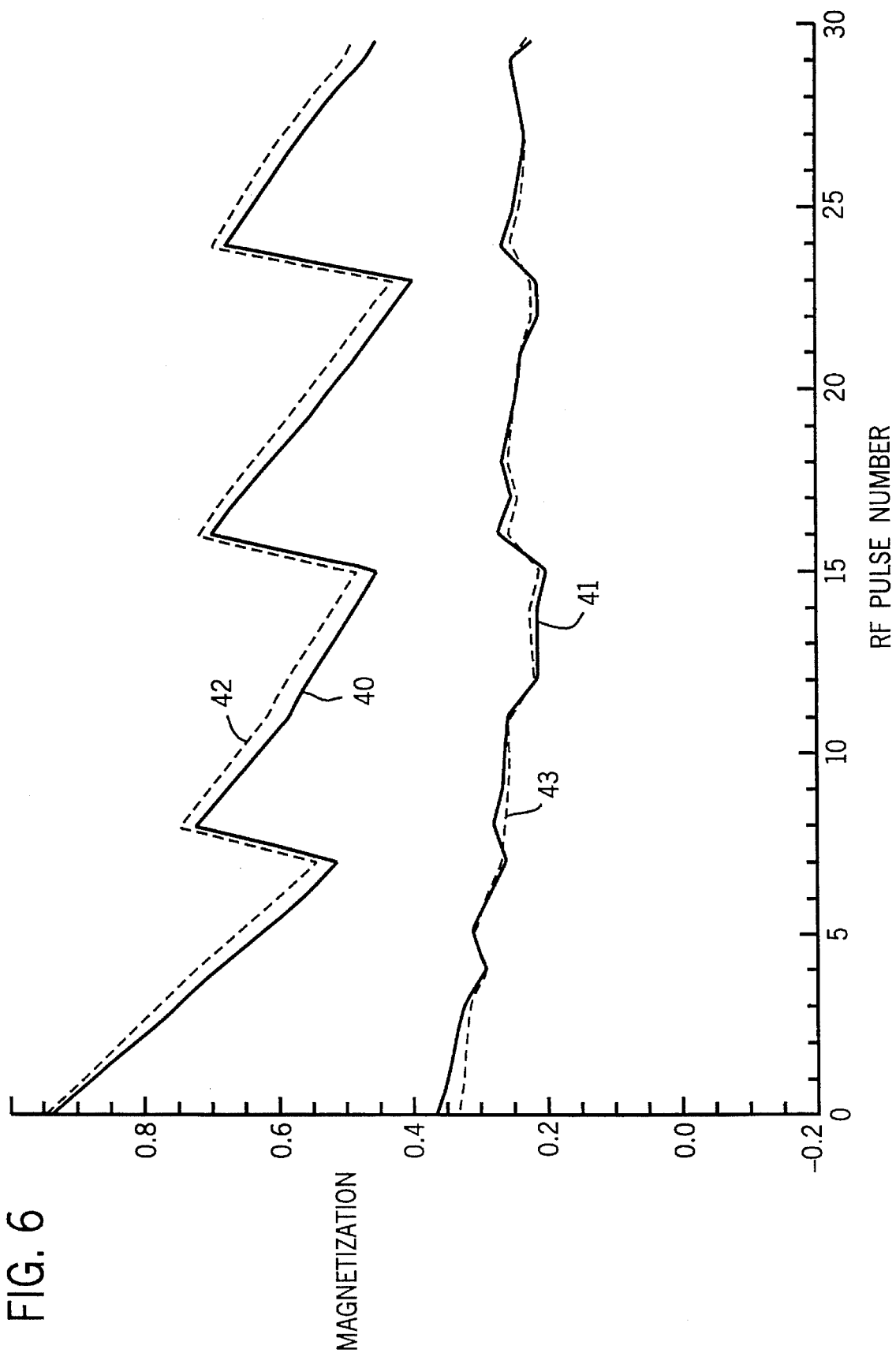
FIG. 6 is a graphic representation of the magnetization when variable flip-angles are employed as shown in FIG. 5

The variable flip-angles are calculated using a formula derived from the Bloch equations with the assumption that all transverse magnetization is spoiled. For constant values of the transverse magnetization, the flip-angles are calculated to be:

$$\tan\alpha_{n-1} = \frac{M_n^- \sin\alpha_n \exp(-TR/T_1)}{M_n^- - M_0(1 - \exp(-TR/T_1))} \quad (1)$$

where n=disdaqs, ..., 0, 1, 2, ..., m+p, p=number of extra views to calculate the variable flip-angle, and $\alpha_{n=m+p}$=target flip-angle. Note that $M_n^-$ is the longitudinal component of magnetization prior to the nth rf pulse. This is similar to the variable flip-angle scheme used by McKinnon (McKinnon GC, Magn. Reson. Med. 1993; 30: 609–616). In order to generate slightly higher flip-angles and yet maintain equal weighting of the k-space views, an approximation of Eq. (1) may also be used. If TR<<$T_1$, we can ignore the exponential term in the numerator to obtain:

$$\tan\alpha_{n-1} = \frac{M_n^- \sin\alpha_n}{M_n^- - M_0(1 - \exp(-TR/T_1))} \quad (2)$$

where Eq. (2) generates a variable flip-angle series of slightly larger flip-angles than Eq. (1). As shown in FIG. 6, the signal generated by Eq. (2) (dotted line 43) is almost identical to the signal using Eq. (1) (solid line 41). The corresponding longitudinal magnetization is also shown for Eq. (2) (dashed line 42) and Eq. (1) (solid line 40). Nominally vales of $T_1$ =300, $M_0$=0.6, and p=1 have been determined to provide optimal results at 1.5T.

Either Eq. (1) or Eq. (2) can be employed without loss of image quality. In the preferred embodiment, Eq. (2) is applied iteratively, and the flip-angles of the disdaqs 212 are also included in the calculation of $\tan \alpha_{n-1}$.

Figure 5:
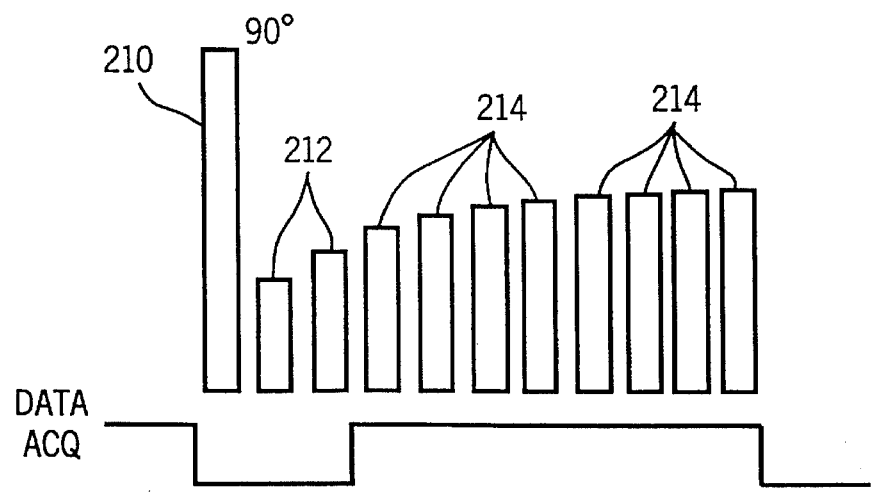
FIG. 5 is a graphic representation of the flip-angles employed in each group of pulse sequences in FIG. 2.

As shown in FIG. 5, each group of pulse sequences includes a 90° RF accelerator pulse sequence 210, followed by two disdaq pulse sequences 212 and eight data acquisition pulse sequences 214. The flip-angles of the RF excitation pulses 21 (FIG. 3) used in the disdaqs 212 and the data acquisition pulse sequences 214 are determined by equation (1). The target flip-angle is typically in the range of 20° to 40° for best contrast and signal-to-noise ratio, and this flip-angle is typically reached on the $n^{th}$ data acquisition pulse sequence 214, where n=number of views in a group.

While the present invention is particularly useful in a fast cardiac gated NMR scan to quickly establish dynamic equilibrium of the magnetization and enhance $T_1$ contrast, it may be used in other applications. For example, the RF accelerator pulse and a series of disdaqs may be used prior to an echo planar imaging (EPI) sequence to enhance $T_1$ contrast without significantly increasing the scan time. This and other applications of the present invention will be apparent to those skilled in the art.

I claim:

1. A method for acquiring NMR data to produce an image of a subject with improved contrast, the step comprising:
    a) subjecting the subject to a polarizing magnetic field;
    b) applying an accelerator RF field to the subject having a flip-angle in the range of 60° to 140°;
    c) performing a disdaq pulse sequence which includes applying an RF field to the subject having a flip-angle substantially less than the flip-angle of the accelerator RF field;
    d) performing a series of NMR measurements in which transverse magnetization is produced by an excitation RF field and an NMR signal produced by the transverse magnetization is acquired; and
    e) reconstructing an image from the acquired NMR signals.

2. The method as recited in claim 1 in which a plurality of disdaq pulse sequences are performed prior to performing the NMR measurements.

3. The method as recited in claim 1 in which the accelerator RF field has a flip-angle of substantially 90°.

4. The method as recited in claim 1 in which the series of NMR measurements are performed using a series of fast gradient echo pulse sequences.

5. The method as recited in claim 4 in which the disdaq pulse sequence is a fast gradient echo pulse sequence.

6. The method as recited in claim 5 in which the accelerator RF field is applied as part of a fast gradient echo pulse sequence.

7. The method as recited in claim 1 in which steps a) through d) are performed a plurality of times before an image is reconstructed from the acquired NMR signals.

8. The method as recited in claim 1 in which a plurality of disdaq pulse sequences are performed in step c).

9. The method as recited in claim 1 in which two disdaq pulse sequences are performed in step c).

10. The method as recited in claim 8 in which the series of NMR measurements performed in step d) are a series of fast gradient echo pulse sequences.

11. The method as recited in claim 10 in which eight fast gradient echo pulse sequences are performed.

* * * * *